United States Patent [19]

Banno

[11] Patent Number: 4,695,988

[45] Date of Patent: Sep. 22, 1987

[54] UNDERWATER PIEZOELECTRIC ARRANGEMENT

[75] Inventor: Hisao Banno, Tohkai, Japan

[73] Assignee: NGK Spark Plug Co. Ltd., Japan

[21] Appl. No.: 772,911

[22] Filed: Sep. 5, 1985

[30] Foreign Application Priority Data

Sep. 12, 1984 [JP] Japan ................... 59-192318
Oct. 19, 1984 [JP] Japan ................... 59-221050

[51] Int. Cl.$^4$ .............................................. G01V 1/38
[52] U.S. Cl. .................................... 367/154; 310/800; 367/155; 367/159; 367/169
[58] Field of Search ............... 367/135, 137, 153, 154, 367/155, 157, 159, 160, 161, 169, 170, 177, 106; 310/319, 800, 337, 357, 358, 359; 73/DIG. 4; 174/101.5; 179/110 A

[56] References Cited

U.S. PATENT DOCUMENTS

| | | | |
|---|---|---|---|
| 3,593,048 | 7/1971 | Dunegan et al. | 310/319 |
| 3,798,474 | 3/1974 | Cassand et al. | 367/169 |
| 4,183,010 | 1/1980 | Miller | 367/154 |
| 4,354,132 | 10/1982 | Borburgh et al. | 310/800 X |
| 4,406,323 | 9/1983 | Edelman | 310/800 X |
| 4,461,179 | 7/1984 | Holt | 310/800 X |
| 4,523,471 | 6/1985 | Lee | 310/334 X |

FOREIGN PATENT DOCUMENTS

| | | | |
|---|---|---|---|
| 105799 | 2/1978 | Japan | 310/800 |
| 1068392 | 1/1984 | U.S.S.R. | 367/170 |

Primary Examiner—Deborah L. Kyle
Assistant Examiner—John E. Griffiths
Attorney, Agent, or Firm—Larson and Taylor

[57] ABSTRACT

Underwater piezoelectric arrangement in which it comprises two piezoelectric layers made of piezoelectric ceramic-polymer composites, one of the layers has larger hydrophone constant than that of the other layer, and by noise cancelling based on the specific construction of the piezoelectric layers only charges or voltages generated by acoustic waves which act on each layer can be selectively detected. The piezoelectric arrangement may be utilized to provide a piezoelectric cable for use in a submarine earthquake searching or fish finding hydrophone, or an acoustic measuring element under water.

11 Claims, 9 Drawing Figures

PRIOR ART

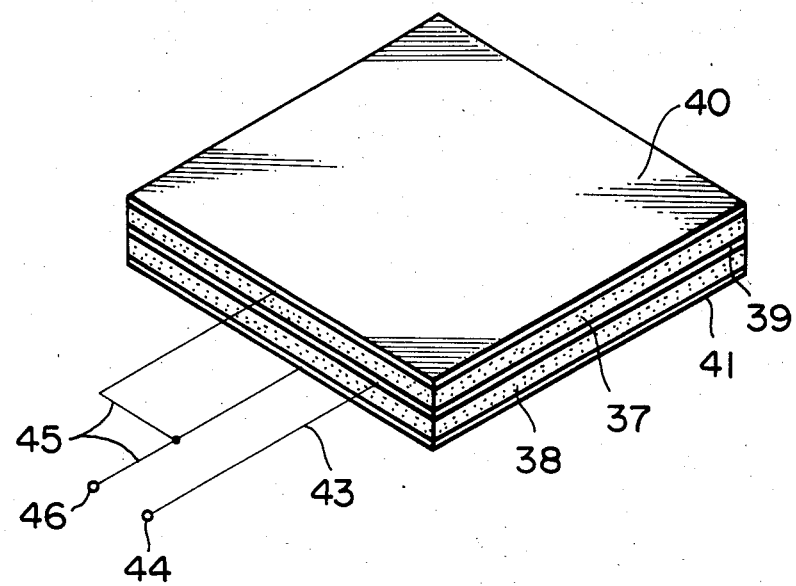
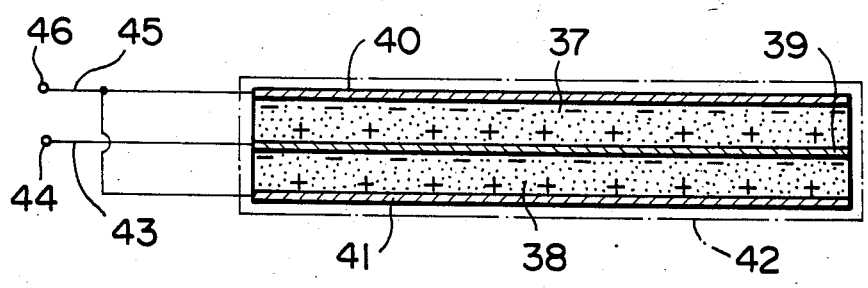
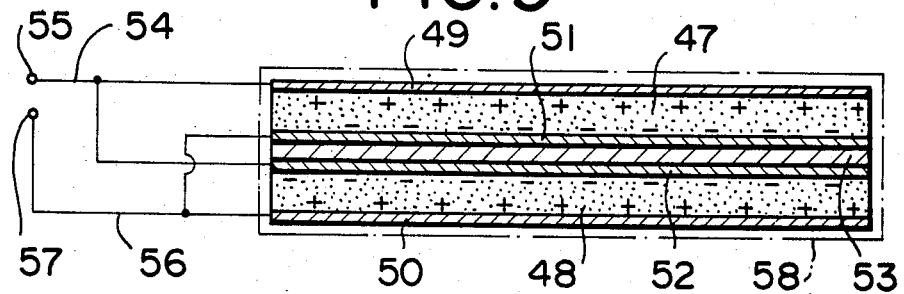

UNDERWATER PIEZOELECTRIC ARRANGEMENT

FIELD OF THE INVENTION

The present invention relates to an underwater piezoelectric arrangement for use in a submarine earthquake searching or fish finding hydrophone, or an acoustic measuring element in a liquid cleanser of a supersonic washing machine.

BACKGROUND OF THE INVENTION

It is known that a piezoelectric ceramic-polymer composite can be produced by mixing ferroelectric ceramic particles of lead zirco-titanate or lead titanate with piezoelectric organic material such as polyvinylidene fluoride, polyvinyl fluoride, polyvinylidene chloride, polyvinyl chloride, nylon or organic material such as synthetic rubber or synthetic resin, and has acoustic impedance characteristics similar to the acoustic impedance of water as compared with a conventional piezoelectric ceramic material. It is also known that when such a composite material is used for a piezoelectric transducer, it can efficiently receive acoustic waves propagated under water to provide advantages of increasing the sensitivity. A piezoelectric transducer of this type is described in U.S. Pat. Nos. 3,921,125, 3,970,862, 4,183,010, 4,056,742 and 4,376,302.

U.S. Pat. No. 4,183,010 discloses a coaxial line hydrophone comprising radially spaced conductors and intermediate dielectric filler material that has both piezoelectric and electret properties such as polyvinylidene fluoride, and method of measuring underwater soundings at either low or high hydrostatic pressures by measuring electrostatically generated signals between the conductors at low hydrostatic pressures and piezoeletrically generated signals at high hydrostatic pressures.

U.S. Pat. No. 4,376,302 discloses a piezoelectric polymer hydrophone in which it comprises a single flexible sheet of a piezoelectric polymer having a plurality of electrode strips on the top and bottom thereof, the electrode strips at the top are staggered by one half the width of a strip relative to the corresponding strips at the bottom of the sheet and the polymer sheet can be rolled into a helix without losing its acoustic sensitivity.

In the prior art as mentioned above, since the piezoelectric device is flexible, the piezoelectric portion of the device is subjected to not only an acoustic wave but also a pressure such as, for example, tensile stress at the blowing stream, or a bending stress due to the stream of water or wave. By these mechanical stresses is occurred a distortion in the longitudinal direction of the piezoelectric portion, that is, in a direction perpendicular to the polarized axis to generate a charge or voltage which produces a noise signal to be superposed on the acoustic wave, thereby decreasing the S/N ratio.

It is, therefore, an object of the present invention to provide an underwater piezoelectric arrangement capable of eliminating the abovementioned drawbacks and disadvantages of the conventional piezoelectric device by obviating the influence of the mechanical pressure except an acoustic wave.

Another object of the invention is to provide an underwater piezoelectric cable which comprises said piezoelectric arrangement.

A further object of the invention is to provide a piezoelectric arrangement for determining an acoustic wave which is propagating under water.

SUMMARY OF THE INVENTION

According to one aspect of the present invention, there is provided an underwataer piezoelectric arrangement comprising a first and second piezoelectric layers made of piezoelectric ceramic-polymer composites, said first and second piezoelectric layers being so arranged that one of the layers has larger hydrophone constant than that of the other layer and the charge or voltage generated by a stress which acts on one layer in its longitudinal direction is substantially equal to that of the other layer, and means for producing a difference in charges or voltages generated by acoustic waves which act on said first and second piezoelectric layers.

One of the first and second piezoelectric layers comprises a piezoelectric ceramic-polymer composite which has large hydrophone constant such as, for example, a mixture of lead titanate ($PbTiO_3$) and organic material such as rubber or resin, and the other piezoelectric layer comprises a piezoelectric ceramic-polymer composite which has small hydrophone constant such as, for example, a mixture of lead zirco-titanate ($Pb(ZrTi)O_3$) and organic material such as rubber or resin.

Each of the first and second piezoelectric layers has an inner and outer surfaces provided with electrode members which may be made of electroconductive coatings.

According to a second aspect of the present invention, there is provided an underwater piezoelectric cable comprising a first and second piezoelectric layers made of a piezoelectric ceramic-polymer composite which are provided around a cable core, said first and second piezoelectric layers being so arranged that one of the layers has larger hydrophone constant than that of the other layer and the charge or voltage generated by a stress which acts on one layer in a direction parallel to the surface thereof is substantially equal to that of the other layer, and means for producing a difference in charges or a voltages generated by acoustic waves which act on said first and second piezoelectric layers.

Said first and second piezoelectric layers may be coaxially provided around the cable core.

The noise cancelling principle in the present invention is based on the following.

When one piezoelectric layer has the hydrophone constant represented by $^1d\,h$ and the piezoelectric constants represented by $^1d_{33}$, $^1d_{31}$, there is the following relation among them.

$$^1d\,h = {^1d_{33}} + 2\,{^1d_{31}}$$

Similarly, when the other piezoelectric layer has the hydrophone constant $^2d\,h$ and the piezoelectric constants $^2d_{33}$, $^2d_{31}$, there is the following relation amount them.

$$^2d\,h = {^2d_{33}} + 2\,{^2d_{31}}$$

The piezoelectric constants $^1d_{33}$ and $^2d_{33}$ indicate electric conversion rates responding to the pressure of radial direction (in the direction parallel to the polarizing axis), and an acoustic wave signal is an electric charge based on the constants. The piezoelectric constants $^1d_{31}$ and $^2d_{31}$ are electric conversion rates responding to the pressure of longitudinal direction (in the direction perpendicular to the polarizing axis), and a noise signal is an electric charge based on the constants.

From the above relation, therefore, one obtains $$^1d\ h - ^2d\ h \neq 0 \tag{1}$$

$$^1d_{31} - ^2d_{31} = 0 \tag{2}$$

Thus, the difference between $^1d_{33}$ and $^2d_{33}$ is produced, the noise signal is removed, and the acoustic wave signal can be produced.

In the present invention, therefore, for the material of one of the first and second piezoelectric layers there is selectively used a material having large hydrophone constant $^1d\ h$ such as, for example, a mixture of lead titanate (PbTiO$_3$) and organic material such as rubber or resin. For example, in the mixture of PbTiO$_3$ and silicone rubber at 7:10, $^1d\ h = 35 \times 10^{-12}$ (C/N).

For the material of the other piezoelectric layer there is selectively used a material having small hydrophone constant $^2d\ h$ such as, for example, a mixture of lead zirco-titanate (Pb(Zr Ti)O$_3$) of organic material such as rubber or resin. For example, the mixture of Pb(Zr Ti)O$_3$ and silicone rubber at 7:10 has the hydrophone constant $^2d\ h = 8 \times 10^{-12}$ (C/N).

Thus, it is appreciated that the above equation (1) can be satisfied when the hydrophone constant of one piezoelectric layer is larger than that of the other piezoelectric layer. On the other hand, these piezoelectric materials have different piezoelectric constants $^1d_{31}$ and $^2d_{31}$. The larger the hydrophone constant $^1d\ h$ is, the smaller the piezoelectric constant $^1d_{31}$ is. For example, in case of PbTiO$_3$ mixed at abovementioned specific ratio. $^1d_{31} = -5 \times 10^{-6}$ (C/N), and in case of the material of Pb(Ti Zr)O$_3$, $^2d_{31} = -25 \times 10^{-6}$ (C/N). In order to satisfy the relation of the equation (2) in the present invention, it is necessary to equalize the piezoelectric constant $^2d_{31}$ of the Pb(Ti Zr)O$_3$ material with the $^1d_{31}$ of the PbTiO$_3$ material, or to decrease the $^2d_{31}$ by reducing the polarizing voltage.

Since the decrease in the $^2d_{31}$ $_{kj}$of the Pb(TiZr)O$_3$ material causes simultaneously the $^2d\ h$ thereof to reduce, the difference between the $^2d\ h$ of the Pb(Ti Zr)O$_3$ material and the $^1d\ h$ of the PbTiO$_3$ material is further increased so that the device has a good sensitivity.

The noise cancelling principle has been described based on the electric charge Q which may be generated in the piezoelectric layers, but this may be similarly described based on the generated voltage V (V=Q/C) merely by taking the electrostatic capacity C into consideration even if the electric charges Q are changed.

By using such noise cancelling principle it is intended to equalize the electric charges or voltages generated in the first and second piezoelectric layers when the piezoelectric device is subjected to a mechanical stress in the longitudinal direction or the direction parallel to the surfaces thereof, and to eliminate these charges or voltages by electrical substraction. Therefore, when any acoustic wave is generated under water, only the electric charge or voltage based on the difference of the hydrophone constants of the two piezoelectric layers can be produced.

BRIEF DESCRIPTION OF THE INVENTION

The invention will be better understood from the following description taken in connection with the accompanying drawings.

FIG. 7 is a perspective view showing a sheet-like piezoelectric arrangement embodying the present invention;

FIG. 8 is an enlarged cross sectional view of the arrangement of FIG. 7;

FIG. 9 is a cross sectional view showing another embodiment of the invention.

DETAILED DESCRIPTION

Figure 1:
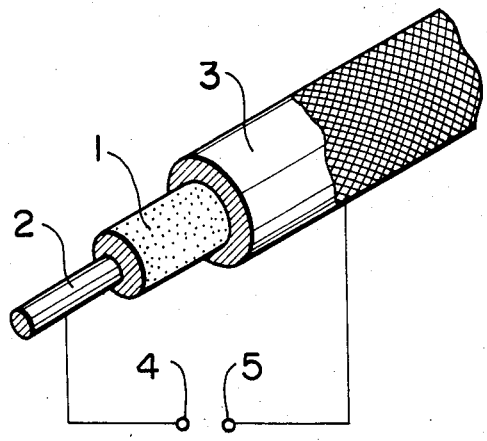
FIG. 1 is a partially fragmental perspective view showing a conventional underwater piezoelectric cable.

In FIG. 1, there is shown a conventional piezoelectric cable in which a piezoelectric layer 1 made of the piezoelectric material is disposed around an electrode core 2, an electroconductive layer 3 of electroconductive paint or the like is disposed on the outer surface of the piezoelectric layer 1, and the piezoelectric layer 1 is radially polarized by applying a predetermined DC voltage between the core 2 and the electroconductive layer 3. The coaxial piezoelectric cable thus formed is dipped into water for receiving acoustic waves propagated under water, thereby producing an output signal on output terminals 4 and 5 which are connected between the core 2 and the electroconductive layer 3.

Figure 2:
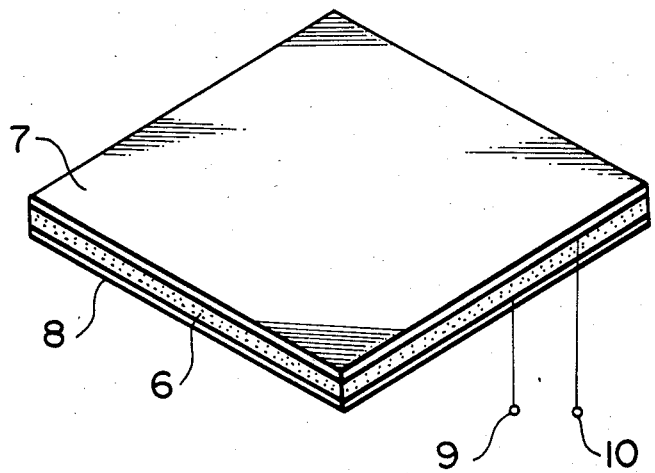
FIG. 2 is a perspective view showing another conventional sheet-like piezoelectric arrangement.

FIG. 2 shows a sheet-like piezoelectric arrangement according to the prior art in which a piezoelectric sheet member 6 made of the piezoelectric material is provided with electrode plates 7 and 8 on the upper and lower surfaces thereof, respectively, and the piezoelectric sheet member 6 is polarized in a thickness direction by applying a predetermined DC voltage between the electrode plates 7 and 8. The sheet-like piezoelectric arrangement thus formed is dipped into water for receiving acoustic waves propagated under water to produce an output signal on output terminals 9 and 10.

In such arrangements as shown in FIGS. 1 and 2, however, the piezoelectric layer or sheet member is flexible, and then is subjected to various mechanical stresses as well as the acoustic waves. These mechanical stresses cause the piezoelectric layer to distort in a direction perpendicular to the polarized axis, whereby an electric charge or voltage may be generataed. The generated electric charge or voltage may produce a noise signal which is to be superposed on the output signal generated by the acoustic wave so that the S/N ratio is decreased.

Figure 3:
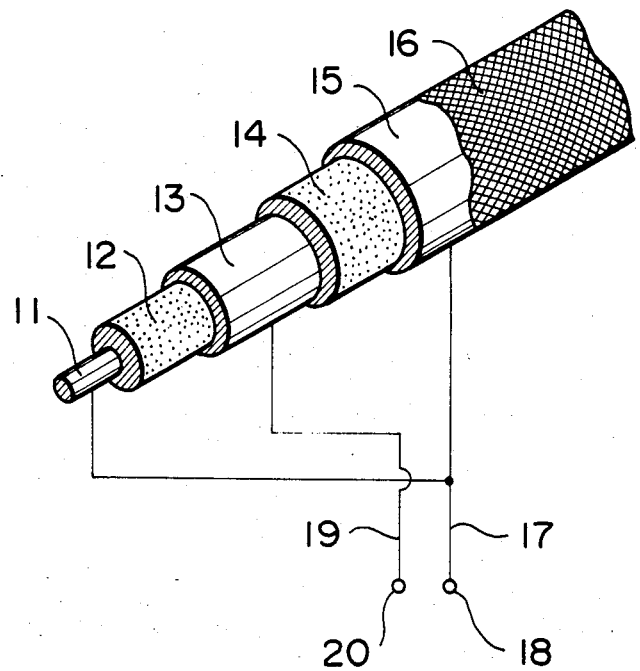
FIG. 3 is a partially fragmental perspective view showing an underwater piezoelectric cable arrangement of a coaxial type embodying the present invention.
Figure 4:
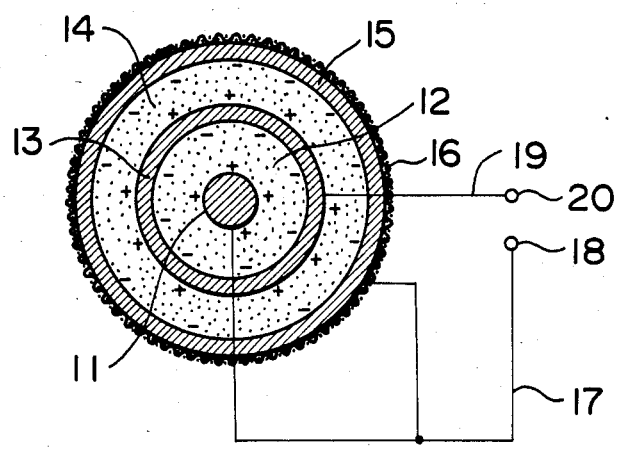
FIG. 4 is an enlarged cross sectional view of the arrangement of FIG. 3.

Reference is now made to FIGS. 3 and 4 of the drawings which schematically show a piezoelectric cable of coaxial type according to the embodiment of the present invention.

In FIGS. 3 and 4, reference numeral 11 designates an electrode core on which an inner piezoelectric layer 12 is provided. This inner piezoelectric layer 12 is made of piezoelectric rubber or the like, and is polarized so that the inside portion becomes positive and the outside portion becomes negative. On the outer surface of the layer 12 there is provided a connecting electrode 13 which may be made of electroconductive paint or the like. A second or outer piezoelectric layer 14 made of piezoelectric rubber or the like is provided on the outer surface of the connecting electrode 13, and is polarized so that the inside portion becomes positive and the outside portion becomes negative. On the outer surface of the second piezoelectric layer 14 and electrode 15 is formed by coating an electroconducting paint or the like, and the electrode 15 is covered with an outer jacket 16 such as braided wire.

For example, the first piezoelectric layer 12 may be constructed by a normal material such as Pb(Ti Zr)O$_3$, and the second piezoelectric layer 14 may be constructed by a material such as PbTiO$_3$ having larger hydrophone constant as described above.

The electrode core 11 connected to the positive pole side of the first layer 12 and the electrode 15 connected to the negative pole side of the second layer 14 are connected by a common lead wire 17 to an output terminal 18, and the electrode 13 interposed between the first layer 12 and the second layer 14 is connected by a lead wire 19 to an output terminal 20. An output signal is produced between the output terminals 18 and 20, and the output terminal 18 is an earth side.

The operation of this embodiment will be described. When the piezoelectric cable is subjected to a stress of a longitudinal direction which may occur due to the wavings, electric charges or voltages are induced in the first and second piezoelectric layers 12 and 14. Since the piezoelectric constants (d$_{31}$) of the first and second layers 12 and 14 are equalized to each other, the charge or voltage induced in the first layer 12 and the charge or voltage induced in the second layer 14 by the stress of the longitudinal direction are almost equal. The positive pole of the first layer 12 and the negative pole of the second layer 14 are electrically shortcircuited through the lead wire 17, and the negative pole of the first layer 12 and the positive pole of the second layer 14 are shortcircuited through the connecting electrode 13. Therefore, no potential difference or voltage difference is produced by the external stress such as waving between the output terminals 18 and 20. On the other hand, any acoustic wave acts on the entire outer periphery of the cable, and has influence on the first and second piezoelectric layers 12 and 14. In this connection, the second piezoelectric lyaer 14 comprises the material having large hydrophone constant, and thus the sensitivity for the acoustic wave of the second layer 14 is higher than that of the first layer 12. Therefore, when the arrangement is subjected to acoustic waves generated under water, an output signal corresponding to a difference in sensitivity is to be produced on the output terminals 18 and 20.

Consequently, the production of the potential due to the external stresses such as waving may be cancelled as described above, and then only an electrical signal corresponding to the acoustic wave may be produced on the output terminals 18 and 20. Thus, the piezoelectric arrangement may be operated to receive only the acoustic wave without influence by bending and the like.

In the embodiment described above, even if the first piezoelectric layer 12 is formed of a material having larger hydrophone constant as compared with the second layer 14, the acoustic wave may substantially equally act on both of the first and second layers 12 and 14 because of the penetrating properties, and thus the same result as before can be obtained.

Figure 5:
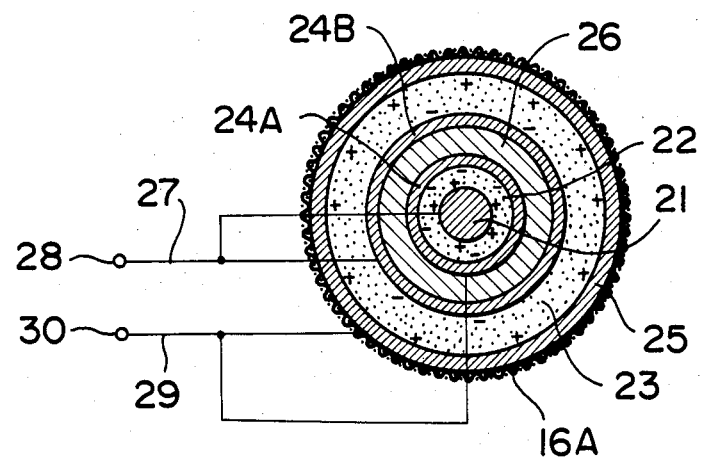
FIG. 5 is a cross sectional view showing a second embodiment according to the present invention.

FIG. 5 shows a second embodiment of the invention in which a first and second piezoelectric layers have polarizing directions which are opposed to each other. Reference numeral 21 designates a central electrode on which a first and second annular piezoelectric layers 22 and 23 are concentrically disposed. Each of the first and second layers 22 and 23 is polarized as shown in FIG. 5. Three concentrically disposed annular electrodes 24A, 24B and 25 are shown surrounding the first and second piezoelectric layers 22 and 23. The annular electrode 24A is contacted with the outer surface of the first layer 22, and the annular electrode 24B is contacted with the inner surface of the second layer 23. The annular electrodes 24A and 24B are insulated by an annular insulator layer 26 interposed therebetween. The positive pole of the first layer 22, that is, the center electrode 21 and the negative pole of the second layer 23, that is, the annular electrode 24B are connected by a lead conductor 27 to an output terminal 28, and the negative pole of the first layer 22 or the annular electrode 24A and the positive pole of the second layer 23 or the annular electrode 25 are connected by a lead conductor 29 to an output terminal 30. The outer surface of the annular electrode 25 is covered with an outer jacket 16A. The operation or function and advantages are similar to those of the previous embodiment, and therefore the description will be omitted.

Figure 6:
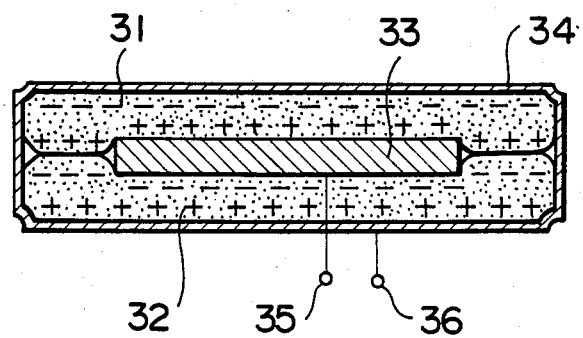
FIG. 6 is a cross sectional view showing a third embodiment according to the invention.

FIG. 6 shows an application of the present invention to a flat cable.

In FIG. 6, a first piezoelectric layer 31 and a second piezoelectric layer 32 are formed in a flat shape, superposed through an electrode plate 33. The outer periphery of the superposed piezoelectric layers 31 and 32 is covered with an electroconductive coating 34. The first piezoelectric layer 31 is so polarized that the outer surface portion is negative and the inner surface portion is positive, and the second piezoelectric layer 32 is so polarized that the outer portion is positive and the inner portion is negative. The positively polarized inner surface portion of the first layer 31 and the negatively polarized inner surface portion of the second layer 32 are shortcircuited by the electrode plate 33 which is connected to an output terminal 35. The negatively polarized outer surface portion of the first layer 31 and the positively polarized outer surface portion of the second layer 32 are shortcircuited by the electroconductive coating 34 which is connected to an output terminal 36.

Even in this flat structure, the first and second piezoelectric layers 31 and 32 may be readily polarized to have the same polarizing direction as in the coaxial cable structure shown in FIG. 5.

In FIGS. 7 and 8 there is shown a sheet-like piezoelectric arrangement intended to detect acoustic waves under water according to the present invention. Reference numerals 37 and 38 designate a first and second piezoelectric layers of rectangular shape made of piezoelectric rubber, each of which is polarized so that the upper surface portion becomes negative and the lower surface portion becomes positive. An electrode plate 39 is interposed between the first and second piezoelectric layers 37 and 38, an electrode plate 40 is provided on the negatively polarized upper surface of the first layer 37, and an electrode plate 41 is provided on the positively polarized lower surface of the second layer 38. The piezoelectric assembly thus constructed should be covered with an electrically insulating coating 42 to insulate the electrode plates 39, 40 and 41 as shown in FIG. 8. The electrode plate 39 is electrically contacted with the lower surface of the first layer 37 and the upper surface of the second layer 38, and is connected by a conductor 43 to an output terminal 44. The electrodes 40 and 41 are connected by a common conductor 45 to an output terminal 46 which is an earth side. One of the first and second piezoelectric layers 37 and 38 is formed of a material having larger hydrophone constant and the other is formed of a normal piezoelectric material.

The piezoelectric arrangement thus constructed may be submerged at suitable positions under water for detecting acoustic waves, whereby the irregularity in the acoustic waves under water may be measured.

The operation or function is substantially similar to that of the embodiment shown in FIGS. 3 and 4, and therefore the detailed description will be omitted.

FIG. 9 shows another embodiment in which the polarizing direction of a first piezoelectric layer 47 is opposite to that of a second piezoelectric layer 48. The first layer 47 is polarized so that the upper surface is positive and the lower surface is negative, and the second layer 48 is polarized so that the upper surface is negative and the lower positive. Two outer electrode plates 49 and 50 are disposed on the positively polarized surfaces of the first and second piezoelectric layers 47 and 48, respectively, and two inner electrode plates 51 and 52 are disposed on the negatively polarized surfaces of the first and second layers 47 and 48, respectively. The inner electrode plates 51 and 52 are insulated from each other by an insulating plate 53 interposed therebetween. The outer electrode plate 49 and the inner electrode plate 52 are connected by a common conductor 54 to an output terminal 55, and the outer electrode plate 50 and the inner electrode plate 51 are connected by a common conductor 56 to an output terminal 57. In order to avoid any undesirable shortcircuiting, the arrangement should be covered with an electrically insulating cover 58.

The other operation and the advantages are similar to those of the previous embodiment, and therefore the description will be omitted.

It is to be understood that the piezoelectric layers shown in FIGS. 7, 8 and 9 may be suitably formed into any other shape, for example, disc shape.

Instead of the connecting means shown in all of the embodiments described above, the charge generated from one piezoelectric layer may be inverted and added to the charge generated from the other piezoelectric layer so as to obtain the difference therebetween as an output signal.

According to the present invention as described above, by cancelling the charges on the first and second piezoelectric layers which are generated when they are subjected to any external pressure, the piezoelectric layer having larger hydrophone constant is intended to produce only the charge corresponding to the acoustic waves. Accordingly, the influence by the external stress such as wavings can be certainly removed, thereby remarkably improving the S/N ratio of the output.

What is claimed is:

1. An underwater piezoelectric arrangement comprising first and second piezoelectric layers, said first piezoelectric layer being made of a polarized ceramic-polymer composite having a first hydrophone constant and generating electrostatic charges of opposite polarities on the opposed surfaces thereof in response to stresses which act on said first piezoelectric layer in a direction parallel to said surfaces thereof, said second piezoelectric layer being made of a poled ceramic-polymer composite having a second hydrophone constant smaller than said first constant and generating electrostatic charges of opposite polarities on the opposed surface thereof in response to stresses which act on said second piezoelectric layer in a direction parallel to said surfaces thereof, the levels of said charges generated on the surfaces of each of said piezoelectric layers in response to said stresses being substantially equal; positive and negative electrode members on respective opposed surfaces of each of said first and second piezoelectric layers; means for electrically connecting the positive electrode member of said first layer and the negative electrode member of said second layer, and for electrically connecting the negative electrode member of said first layer and the positive electrode member of said second layer; and means for connecting a pair of terminals to said positive electrode members and negative electrode members so as to provide detection of an output signal produced in accordance with the difference between the hydrophone constants of said first and second piezoelectric layers only in response to acoustic waves being received by the arrangement and so as to provide cancellation of noise signals produced in accordance with said charges on said first and second piezoelectric layers.

2. An underwater piezoelctric arrangment as claimed in claim 1, wherein the polarizing direction of said first piezoelectric layer is the same as that of said second piezoelectric layer.

3. An underwater piezoelectric arrangement as claimed in claim 1, wherein the polarizing direction of said first piezoelectric layer is opposite to that of said second piezoelectric layer.

4. An underwater piezoelectric arrangement as claimed in claim 1, wherein said first piezoelectric layer is formed of a mixture of lead titanate ($PbTiO_3$) and polymer, and said second piezoelectric layer is formed of a mixture of lead zirco-titanate ($Pb(ZrTi)O_3$) and polymer.

5. An underwater piezoelectric arrangement as claimed in claim 1, wherein each of said first and second piezoelectric layers is in the form of a sheet.

6. An underwater piezoelectric cable comprising first and second piezoelectric layers said first piezoelectric layer being made of a polarized ceramic-polymer composite having a first hydrophone constant and generating electrostatic charges of opposite polarities on the opposed surfaces thereof in response to stresses which act on said first piezoelectric layer in a longitudinal direction, said second piezoelectric layer being made of a poled ceramic-polymer composite having a second hydrophone constant smaller than said first constant and generating electrostatic charges on the opposed surfaces thereof in response to stresses which act in a longitudinal direction on said second layer, the levels of said charges generated on the surfaces of said first and second piezoelectric layers in response to said stresses being substantially equal; positive and negative electrode members on respective opposed surfaces of each of said first and second piezoelectric layers; means for electrically connecting the positive electrode member of said first layer and the negative electrode member of said second layer, and for positively connecting said negative electrode member of said first layer and said positive electrode of said second layer; and means for connecting a pair of output terminals to said positive electrode members and negative electrode members so as to provide for detection of an output signal produced in accordance with the difference between the hydrophone constant of said first and second piezoelectric layers only in response to acoustic waves being received by the arrangement and so as to provide cancellation of noise signals produced in accordance with said charges on said first and second piezoelectric layers.

7. An underwater piezoelectric cable as claimed in claim 6, wherein said first and second piezoelectric layers have opposite polarizing directions.

8. An underwater piezoelectric cable as claimed in claim 6, wherein said first and second piezoelectric layers have same polarizing direction.

9. An underwater piezoelectric cable as claimed in claim 6, wherein an insulator layer is interposed between said first and second piezoelectric layers.

10. An underwater piezoelectric cable as claimed in claim 6, wherein said first and second piezoelectric layers are annular and are coaxially disposed around a cable core, said core comprising one of said electrode members.

11. An underwater piezoelectric cable as claimed in claim 10, wherein said cable core is a central electrode.

* * * * *